(12) United States Patent
Kato et al.

(10) Patent No.: US 8,692,125 B2
(45) Date of Patent: Apr. 8, 2014

(54) MULTILAYER SUBSTRATE

(75) Inventors: Noboru Kato, Nagaokakyo (JP); Jun Sasaki, Nagaokakyo (JP); Satoshi Ishino, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 118 days.

(21) Appl. No.: 13/369,363

(22) Filed: Feb. 9, 2012

(65) Prior Publication Data

US 2012/0138340 A1 Jun. 7, 2012

Related U.S. Application Data

(63) Continuation of application No. PCT/JP2010/063308, filed on Aug. 5, 2010.

(30) Foreign Application Priority Data

Aug. 11, 2009 (JP) .................................. 2009-186282

(51) Int. Cl.
*H05K 1/00* (2006.01)

(52) U.S. Cl.
USPC ......................................................... 174/254

(58) Field of Classification Search
USPC .................................. 174/254; 361/749–751
See application file for complete search history.

(56) References Cited

U.S. PATENT DOCUMENTS 7,629,538 B2 * 12/2009 Heisen et al. ................. 174/254
2003/0116343 A1 6/2003 Adachi et al.

FOREIGN PATENT DOCUMENTS

| JP | 55-52860 U | 4/1980 |
|---|---|---|
| JP | 61-111595 A | 5/1986 |
| JP | 07-106787 A | 4/1995 |
| JP | 2000-138422 A | 5/2000 |
| JP | 2002-290034 A | 10/2002 |
| JP | 2003-179317 A | 6/2003 |
| JP | 2006-080173 A | 3/2006 |
| JP | 2006-165079 A | 6/2006 |
| JP | 2006-228922 A | 8/2006 |
| JP | 2007-049060 A | 2/2007 |
| JP | 2007-134473 A | 5/2007 |

OTHER PUBLICATIONS

Official Communication issued in International Patent Application No. PCT/JP2010/063308, mailed on Sep. 21, 2010.

* cited by examiner

*Primary Examiner* — Jeremy Norris
(74) *Attorney, Agent, or Firm* — Keating & Bennett, LLP

(57) ABSTRACT

A multilayer substrate that retains a curved state without causing fluctuations in electrical characteristics includes a main body including a plurality of insulating sheets to be stacked and made of a flexible material. A signal wire extends in the main body. A ground conductor is provided at a positive-direction side in a z-axis direction relative to the signal wire in the main body, and overlaps the signal line in a plan view seen from the z-axis direction. A ground conductor is provided on a negative-direction side in the z-axis direction relative to the signal wire in the main body, and overlaps the signal line in a plan view seen from the z-axis direction. The state in which the main body is curved so that the signal wire defines an arc is retained by plastic deformation of the ground conductors.

8 Claims, 5 Drawing Sheets

FIG. 5A
PRIOR ART
500
FIG. 5B
PRIOR ART
500
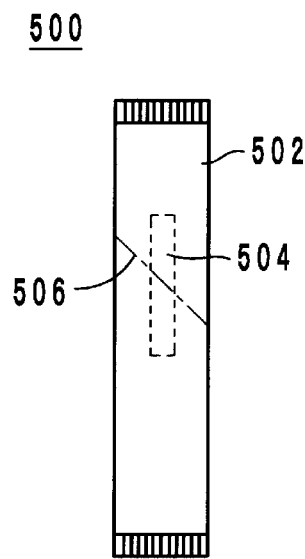
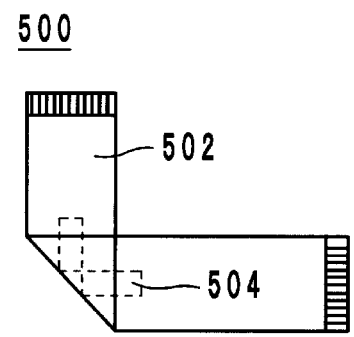

MULTILAYER SUBSTRATE

BACKGROUND OF THE INVENTION

1. Field of the Invention

The present invention relates to a multilayer substrate, and more particularly relates to a multilayer substrate including a ground conductor and a signal wire.

2. Description of the Related Art

As an example of existing multilayer substrates, a flexible printed substrate disclosed in Japanese Unexamined Patent Application Publication No. 2006-165079 is known. FIGS. 5A and 5B illustrate the configuration of a flexible printed substrate 500 disclosed in Japanese Unexamined Patent Application Publication No. 2006-165079.

The flexible printed substrate 500 includes a composite sheet 502 and a metal plate 504 as illustrated in FIG. 5A. The composite sheet 502 includes a plurality of stacked insulating sheets and has a conductor pattern (not shown) in the composite sheet 502. The metal plate 504 is provided in the composite sheet 502. The above-described flexible printed substrate 500 is bent along a chain line 506 shown in FIG. 5A. During bending, the metal plate 504 is plastically deformed such that the flexible printed substrate 500 retains a folded state illustrated in FIG. 5B. Accordingly, the flexible printed substrate 500 can be used in the folded state.

When the metal plate 504 and the conductor pattern are close to each other, a stray capacitance may be formed between the metal plate 504 and the conductor pattern in the flexible printed substrate 500. As a consequence, electrical characteristic values of the flexible printed substrate 500 may often deviate from desired values.

SUMMARY OF THE INVENTION

Accordingly, preferred embodiments of the present invention provide a multilayer substrate capable of retaining a curved state without causing fluctuations in electrical characteristics.

A multilayer substrate according to a preferred embodiment of the present invention includes a main body including a plurality of insulating sheets to be stacked and made of a flexible material, a signal wire in the main body, a first ground conductor that is provided at one side of the signal wire in a stacking direction in the main body, such that the first ground conductor overlaps the signal wire in a plan view seen from the stacking direction, and a second ground conductor that is provided at the other side of the signal wire in the stacking direction in the main body, such that the second ground conductor overlaps the signal wire in a plan view seen from the stacking direction, wherein the main body containing the single wire retains a curved state by plastic deformation of the first and second ground conductors.

Preferred embodiments of the present invention allow a multilayer substrate to retain a curved state without changing or affecting electrical characteristics of the substrate.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A and 5B illustrate the configuration of the flexible printed substrate disclosed in Japanese Unexamined Patent Application Publication No. 2006-165079.

DETAILED DESCRIPTION OF THE PREFERRED EMBODIMENTS

Hereinafter, a signal line related to preferred embodiments of a multilayer substrate according to the present invention will be described with reference to drawings.

Figure 1:
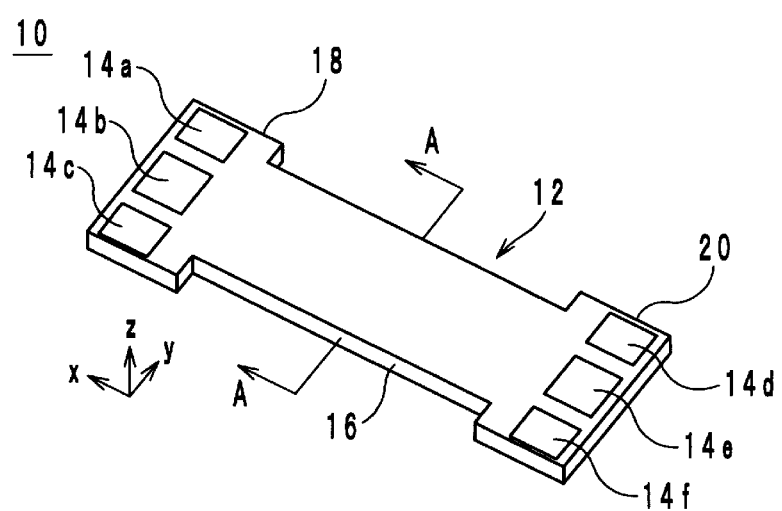
FIG. 1 is a perspective view of a signal line according to a preferred embodiment of the present invention.
Figure 2A:
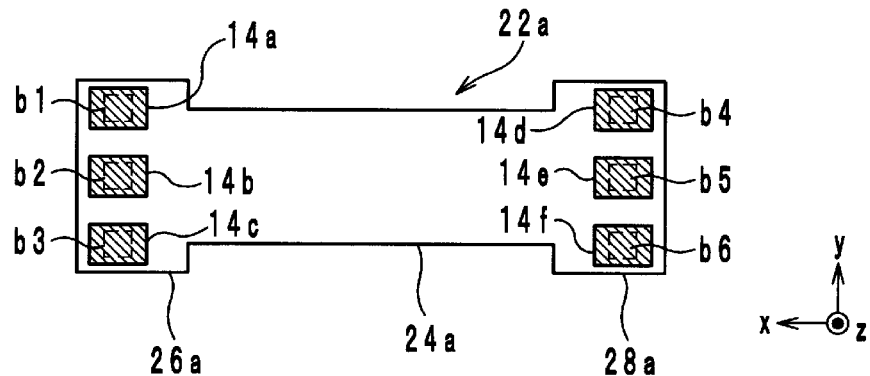
FIGS. 2A-2D illustrate exploded views of the signal line of FIG. 1.
Figure 2B:
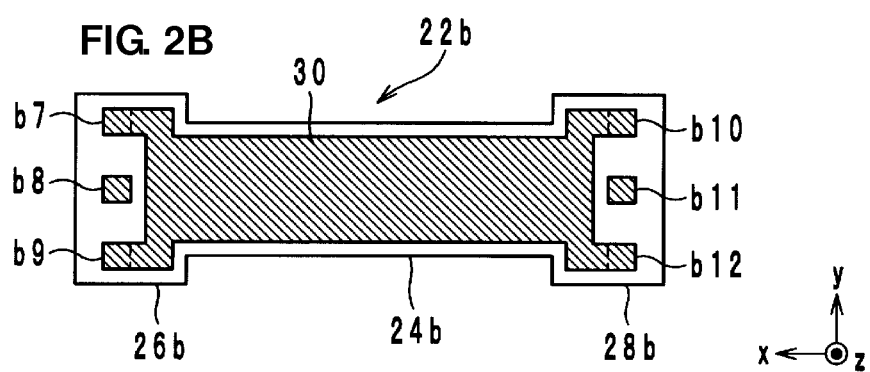
Figure 2C:
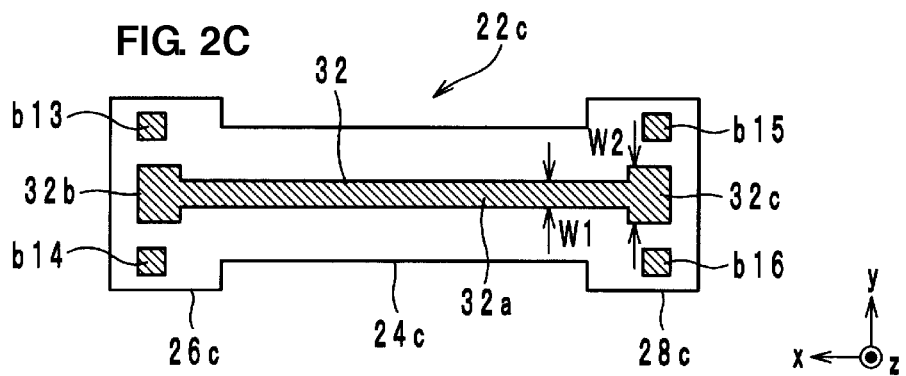
Figure 2D:
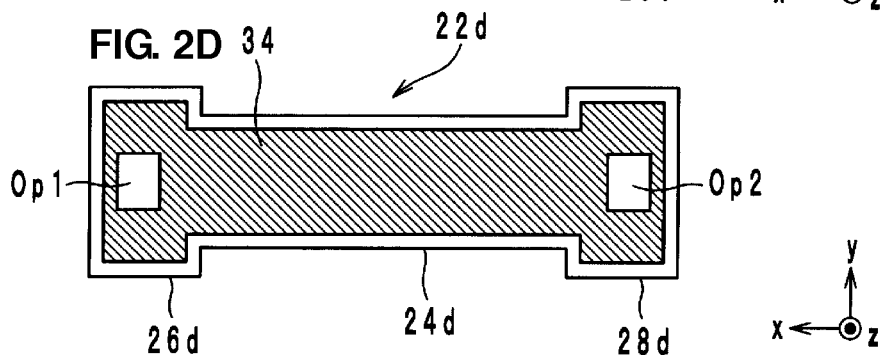
Figure 3:
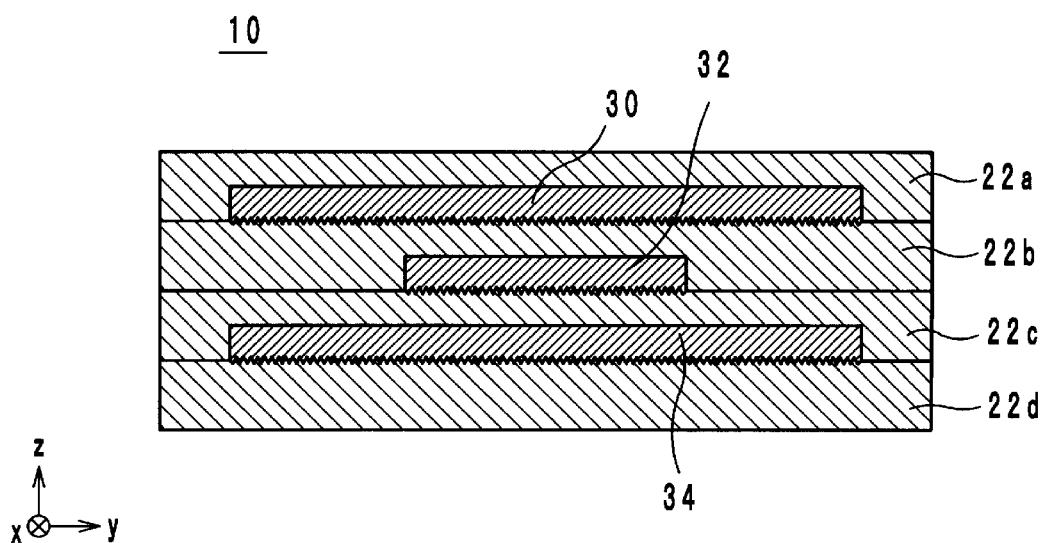
FIG. 3 is a cross sectional view taken along A-A shown in FIG. 1.

The configuration of a signal line according to a preferred embodiment of the present invention will be described with reference to the drawings. FIG. 1 is a perspective view of a signal line 10 according to a preferred embodiment of the present invention. FIGS. 2A-2D illustrate exploded views of the signal line 10 of FIG. 1. FIG. 3 is a cross sectional view taken along A-A shown in FIG. 1. In FIGS. 1 to 3, the stacking direction of the signal line 10 is defined as a z-axis direction. Further, the longitudinal direction of the signal line 10 is defined as an x-axis direction, and a direction orthogonal to the x-axis direction and the z-axis direction is defined as a y-axis direction.

The signal line 10 establishes a connection between two circuit substrates in, for example, an electronic device such as a mobile phone. As illustrated in FIGS. 1 and 2, the signal line 10 includes a main body 12, external terminals 14 (14a to 14f), ground conductors 30 and 34, a signal wire 32, and via-hole conductors b1 to b16.

The main body 12 includes a signal-wire portion 16 and connector portions 18 and 20 as illustrated in FIG. 1. The signal-wire portion 16 extends in the x-axis direction, and includes the signal wire 32 and the ground conductors 30 and 34. The signal-wire portion 16 can be bent into a U-shape. The connector portions 18 and 20 are provided on both ends of the signal-wire portion 16 in the x-axis direction, and connected to the connectors of a circuit substrate which is not shown. The main body 12 includes insulating sheets 22 (22a to 22d) illustrated in FIGS. 2A-2D, which are stacked in that order from the positive-direction side to the negative-direction side in the z-axis direction.

The insulating sheet 22 includes a thermoplastic resin such as a liquid-crystal polymer having flexibility. The insulating sheet 22 preferably has a Young's modulus of about 2 GPa to about 30 GPa, for example. As illustrated in FIGS. 2A-2D, the insulating sheets 22a to 22d include signal-wire portions 24a to 24d, and the connector portions 26a to 26d and 28a to 28d, respectively. The signal-wire portion 24 constitutes the signal-line portion 16 of the main body 12, and the connector portions 26 and 28 constitute the connector portions 18 and 20 of the main body 12, respectively. Further, the main surface of the insulating sheet 22 on the positive-direction side in the z-axis direction is referred to as a top surface, and that of the insulating sheet 22 on the negative-direction side in the z-axis direction is referred to as a back surface.

The external terminals 14a to 14c are arranged on the top surface of the connector portion 26a to define a line in the y-axis direction as illustrated in FIGS. 2A-2D. When the connector portion 18 is inserted into a connector of the circuit substrate, the external terminals 14a to 14c are brought into contact with terminals provided in the connector. More specifically, the external terminals 14a and 14c are brought into contact with ground terminals provided in the connector, and the external terminal 14b is brought into contact with a signal terminal provided in the connector. Accordingly, ground potentials are applied to the external terminals 14a and 14c, and a high-frequency signal (2 GHz, for example) is applied to the external terminal 14b.

The external terminals 14d to 14f are provided on the top surface of the connector portion 28a to define a line in the y-axis direction. When the connector portion 20 is inserted into a connector of the circuit substrate, the external terminals 14d to 14f are brought into contact with terminals provided in the connector. More specifically, the external terminals 14d and 14f are brought into contact with ground terminals provided in the connector, and the external terminal 14e is brought into contact with a signal terminal provided in the connector. Accordingly, ground potentials are applied to the external terminals 14d and 14f, and a high-frequency signal (2 GHz, for example) is applied to the external terminal 14e.

The signal wire 32 includes a metal film preferably made of a copper foil, for example. As illustrated in FIGS. 2A-2D, the signal wire 32 is attached to the top surface of the insulating sheet 22c and extended in the main body 12. More specifically, the signal wire 32 includes a line portion 32a and connection portions 32b and 32c. The line portion 32a is extended on the top surface of the signal-wire portion 24c in the x-axis direction. Then, the connection portion 32b is connected to an end of the line portion 32a on the positive-direction side in the x-axis direction. The connection portion 32c is connected to an end of the line portion 32a on the negative-direction side in the x-axis direction. Then, a line width W1 of the line portion 32a in the y-axis direction is narrower than a line width W2 of the connection portions 32b and 32c in the y-axis direction. Further, as illustrated in FIG. 3, the surface roughness of a main surface (back surface) of the signal wire 32 on the negative-direction side in the z-axis direction is greater than that of a main surface (top surface) of the signal wire 32 on the positive-direction side in the z-axis direction so that the signal wire 32 is brought into contact with the insulating sheet 22c more intimately. More specifically, the surface roughness of the back surface of the signal wire 32 preferably is about 9 μm to about 50 μm, and that of the top surface of the signal wire 32 is about 0 μm to about 6 μm, for example. Accordingly, the back surface of the signal wire 32 is engaged in the top surface of the insulating sheet 22c as illustrated in FIG. 3 so that the signal wire 32 is attached to the insulating sheet 22c. The signal wire 32 includes a copper layer preferably having a thickness of about 5 μm to about 25 μm in the z-axis direction, and preferably has a Young's modulus of about 100 GPa to about 150 GPa, for example. Incidentally, the signal wire 32 is pressure-contacted on the insulating sheet 22b at the manufacturing time so that the signal wire 32 is brought into intimate contact with the insulating sheet 22b. Therefore, the signal wire 32 is attached to the insulating sheet 22b far more weakly than to the insulating sheet 22c.

The ground conductor 30 is provided on the positive-direction side in the z-axis direction relative to the signal wire 32 as illustrated in FIGS. 2A-2D. More specifically, the ground conductor 30 is attached to the top surface of the insulating sheet 22b. The ground conductor 30 extends on the top surface of the signal-wire portion 24b in the x-axis direction. An end of the ground conductor 30 is placed on the connector portion 26b in the state of being divided into two branches, and another end of the ground conductor 30 is placed on the connector portion 28b in the state of being divided into two branches. Further, the ground conductor 30 overlaps the signal wire 32 in a plan view from the z-axis direction as illustrated in FIGS. 2A-2D and 3.

Further, as illustrated in FIG. 3, the surface roughness of a main surface (back surface) of the ground conductor 30 on the negative-direction side in the z-axis direction is greater than that of a main surface (top surface) of the ground conductor 30 on the positive-direction side in the z-axis direction so that the ground conductor 30 is brought into contact with the insulating sheet 22b more intimately. More specifically, the surface roughness of the back surface of the ground conductor 30 preferably is about 9 μm to about 50 μm, and that of the top surface of the ground conductor 30 preferably is about 0 μm to about 6 μm, for example. Accordingly, the back surface of the ground conductor 30 is engaged in the top surface of the insulating sheet 22b as illustrated in FIG. 3 so that the ground conductor 30 is attached to the insulating sheet 22b. The ground conductor 30 preferably includes a copper layer having a thickness of about 5 μm to about 25 μm in the z-axis direction, and preferably has a Young's modulus of about 100 GPa to about 150 GPa, for example. Therefore, the ground conductor 30 is attached to the insulating sheet 22a far more weakly than to the insulating sheet 22b.

The ground conductor 34 is provided on the negative-direction side in the z-axis direction relative to the signal wire 32 as illustrated in FIGS. 2A-2D. More specifically, the ground conductor 34 is attached to the top surface of the insulating sheet 22d. The ground conductor 34 extends on the top surface of the signal-wire portion 24d in the x-axis direction. On the connector portion 26d, both ends of the ground conductor are wider in the y-axis direction than the other portion. Further, the ground conductor 34 is provided with openings Op1 and Op2 at positions overlapping the connection portions 32b and 32c in a plan view from the z-axis direction. An increase in the stray capacitance between the signal wire 32 and the ground conductor 34 is reduced by providing the openings Op1 and Op2. Further, the ground conductor 34 overlaps the signal wire 32 in a plan view from the z-axis direction as illustrated in FIGS. 2A-2D.

Incidentally, both ends of the ground conductor 34 may branch on the connector portions 26d and 28d as is the case with the ground conductor 30. However, electrode areas obtained by increasing the line width of the ground conductor 34 on the connector portions 26d and 28d, and providing the openings Op1 and Op2 at positions overlapping the connection portions 32b and 32c become greater than those obtained by causing the ground conductor 34 to branch on the connector portions 26d and 28d, which favorably increases the stiffness of the connector portions 26d and 28d.

In the main body 12 of the signal line 10, the line width W1 of the line portion 32a in the y-axis direction is smaller than the line width W2 of the connection portions 32b and 32c in the y-axis direction. Further, the electrode area of the connector portions 26d and 28d are increased as described above. Accordingly, when the signal-wire portion 16 extending in the x-axis direction is bent, the connector portions 18 and 20 are less bendable than the signal-wire part 16. As a consequence, the signal-wire portion 16 can be bent into a U-shape with increased stability.

Further, as illustrated in FIG. 3, the surface roughness of a main surface (back surface) of the ground conductor 34 on the negative-direction side in the z-axis direction is greater than that of a main surface (top surface) of the ground conductor 34 on the positive-direction side in the z-axis direction so that the ground conductor 34 is brought into contact with the insulating sheet 22d more intimately. More specifically, the surface roughness of the back surface of the ground conductor 34 preferably is about 9 μm to about 50 μm, and that of the top surface of the ground conductor 34 preferably is about 0 μm to about 6 μm, for example. Accordingly, the back surface of the ground conductor 34 is engaged in the top surface of the insulating sheet 22d as illustrated in FIG. 3 so that the ground conductor 34 is attached to the insulating sheet 22d. The ground conductor 34 includes a copper layer preferably having a thickness of about 5 μm to about 25 μm in the z-axis direction and preferably has a Young's modulus of about 100 GPa to about 150 GPa, for example. Therefore, the ground conductor 34 is attached to the insulating sheet 22c far more weakly than to the insulating sheet 22d.

Incidentally, the spacing between the ground conductors 30 and 34 in the z-axis direction preferably is about 50 μm to about 200 μm, for example.

Each of the via-hole conductors b1 and b3 passes through the connector portion 26a in the z-axis direction so that the external terminals 14a and 14c are connected to the ground conductor 30 as illustrated in FIGS. 2A-2D. The via-hole conductor b2 passes through the connector portion 26a in the z-axis direction and is connected to the external terminal 14b as illustrated in FIGS. 2A-2D.

Each of the via-hole conductors b7 and b9 passes through the connector portion 26b in the z-axis direction, and is connected to the ground conductor 30 as illustrated in FIGS. 2A-2D. The via-hole conductor b8 passes through the connector portion 26b in the z-axis direction so that the via-hole conductor b2 is connected to the signal wire 32 as illustrated in FIGS. 2A-2D.

Each of the via-hole conductors b13 and b14 passes through the connector portion 26c in the z-axis direction so that the via-hole conductors b7 and b9 are connected to the ground conductor 34 as illustrated in FIGS. 2A-2D. Accordingly, the external terminal 14a is connected to the ground conductors 30 and 34 via the via-hole conductors b1, b7, and b13, and the external terminal 14c is connected to the ground conductors 30 and 34 via the via-hole conductors b3, b9, and b14. Further, the external terminal 14b is connected to the signal wire 32 via the via-hole conductors b2 and b8.

Each of the via-hole conductors b4 and b6 passes through the connector portion 28a in the z-axis direction so that the external terminals 14d and 14f are connected to the ground conductor 30 as illustrated in FIGS. 2A-2D. The via-hole conductor b5 passes through the connector portion 28a in the z-axis direction, and is connected to the external terminal 14e as illustrated in FIGS. 2A-2D.

Each of the via-hole conductors b10 and b12 passes through the connector portion 28b in the z-axis direction, and is connected to the ground conductor 30 as illustrated in FIGS. 2A-2D. The via-hole conductor b11 passes through the connector portion 28b in the z-axis direction so that the via-hole conductor b5 is connected to the signal wire 32 as illustrated in FIGS. 2A-2D.

Each of the via-hole conductors b15 and b16 passes through the connector portion 28c in the z-axis direction so that the via-hole conductors b10 and b12 are connected to the ground conductor 34 as illustrated in FIGS. 2A-2D. Accordingly, the external terminal 14d is connected to the ground conductors 30 and 34 via the via-hole conductors b4, b10, and b15, and the external terminal 14f is connected to the ground conductors 30 and 34 via the via-hole conductors b6, b12, and b16. Further, the external terminal 14e is connected to the signal wire 32 via the via-hole conductors b5 and b11.

The insulating sheets 22a to 22d having the above-described configurations are stacked so that the ground conductors 30 and 34, and the signal wire 32 define a strip line structure. That is, the signal wire 32 is sandwiched between the ground conductors 30 and 34 in the z-axis direction, and stays in a region where the ground conductors 30 and 34 are provided in a plan view from the z-axis direction as illustrated in FIGS. 2A-2D and 3. Further, all of the ground conductor 30, the signal wire 32, and the ground conductor 34 are attached to the top surfaces of the insulating sheets 22b to 22d where those are provided.

Further, in FIG. 3, the insulating sheet 22a may not be arranged so that the ground conductor 30 is exposed. As a consequence, the restoring force caused by the elasticity of the insulating sheet 22a is reduced and the bending state is easily retained.

Figure 4A:
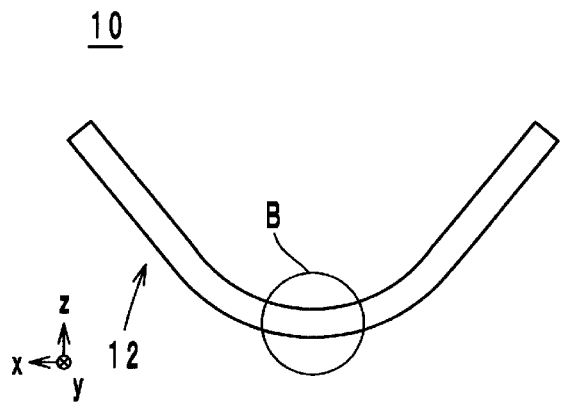
FIG. 4A illustrates the state where the signal line is curved and FIG. 4B is an enlarged view of portion B shown in FIG. 4A.
Figure 4B:
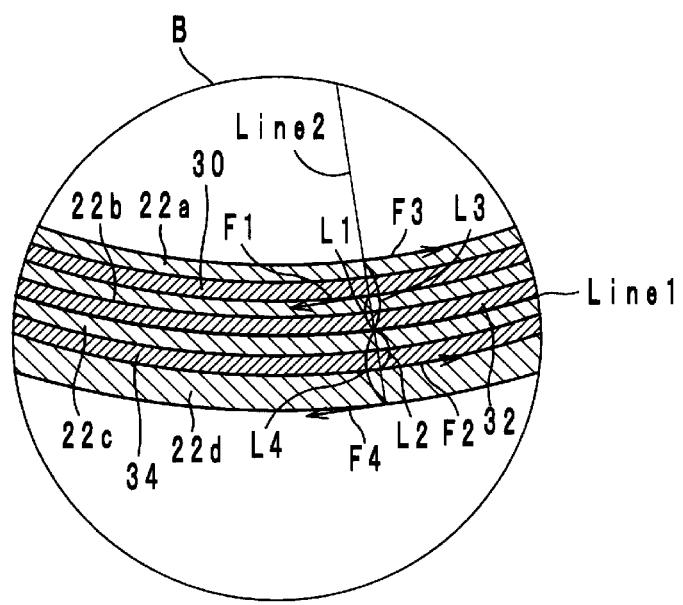

Next, the use state of the signal line 10 will be described. FIG. 4A illustrates the state where the signal line 10 is curved. FIG. 4B is an enlarged view of portion B shown in FIG. 4A.

The signal line 10 is curved so that the signal wire projects toward the negative-direction side in the z-axis direction in a plan view from the y-axis direction as illustrated in FIG. 4A. At that time, the ground conductors 30 and 34 are plastically deformed, and the insulating sheet 22 is elastically deformed. More specifically, no expansion/contraction occurs in the insulating sheets 22b and 22c on a border Line1 (that is, the midpoint of the main body 12 in the z-axis direction) between the insulating sheet 22c and the signal wire 32 (or the insulating sheet 22b) that are illustrated in FIG. 4B. Further, elastic contractions occur in the insulating sheets 22a and 22b provided on the positive-direction side in the z-axis direction relative to the border Line1. On the other hand, elastic expansions occur in the insulating sheets 22c and 22d provided on the negative-direction side in the z-axis direction relative to the border Line1.

Further, the ground conductor 30 is provided on the positive-direction side in the z-axis direction relative to the border Line1 as illustrated in FIG. 4B. Therefore, the ground conductor 30 is plastically deformed in the state of contracting in the x-axis direction. On the other hand, the ground conductor is provided on the negative-direction side in the z-axis direction relative to the border Line1 as illustrated in FIG. 4B. Therefore, the ground conductor 34 is plastically deformed in the state of expanding in the x-axis direction. The curved state of the main body 12 is retained by the above-described plastic deformation of the ground conductors 30 and 34. Hereinafter, the mechanism to retain the curved state of the main body 12 will be described in more detail.

First, a line extending from the center of an arc defined by the signal wire 32 is determined to be a line Line2. Then, on the line Line2, the distance from the border Line1 to the border between the insulating sheet 22b and the ground conductor 30 is determined to be L1, and the distance from the border Line1 to the border between the insulating sheet 22d and the ground conductor 34 is determined to be L2. Further, on the line Line2, the distance from the border Line1 to the top surface of the insulating sheet 22a is determined to be L3, and the distance from the border Line1 to the back surface of the insulating sheet 22d is determined to be L4.

When the main body 12 is curved, the restoring force restoring the main body 12 to the linearly extending state as in FIG. 1 is exerted on the insulating sheets 22a to 22d due to the elasticity of themselves. More specifically, since a contraction occurs in the insulating sheet 22a, a force F3 causing expansion occurs. On the other hand, since an expansion occurs in the insulating sheet 22d, a force F4 causing contraction is exerted. Although a force causing expansion is exerted on the insulating sheet 22b and a force causing contraction is exerted on the insulating sheet 22c, those are relatively small and omitted here.

Furthermore, since the two ground conductors 30 and 34, which are not plastically deformed alone, are parallel to each other at a specified distance, the ground conductors are plastically deformed as described above. Accordingly, even though the restoring force of the insulating sheet 22 is exerted on the ground conductors 30 and 34, the force retaining the plastic-deformation state of the ground conductors 30 and 34 exceeds the restoring force so that the curved state of the main body 12 is retained. More specifically, a force F1 obstructing the expansion of the insulating sheets 22a and 22b occurs in the ground conductor 30. That is, the forces F1 and F3 are vectors pointing in opposite directions. Further, a force F2 obstructing the contraction of the insulating sheets 22c and 22d occurs in the ground conductor 34. That is, the forces F2 and F4 are vectors pointing in opposite directions.

When the above-described forces F1 to F4 occur, moments caused by the forces F1 to F4 are determined to be moments M1 to M4. The moments M1 to M4 are illustrated as below. Further, an intersection point of the border Line1 and the line Line2 is determined to be a center, and a moment occurring clockwise is determined to be positive and that occurring counterclockwise is determined to be negative.

$$M1 = -F1 \times L1$$

$$M2 = -F2 \times L2$$

$$M3 = F3 \times L3$$

$$M4 = F4 \times L4$$

Then, the main body 12 retains the curved state with a curvature amount obtained when the total sum of M1 to M4 is 0.

Here, there are various conditions for retaining the curved state of the main body 12 by the plastic deformation of the ground conductors 30 and 34 in the signal line 10. Therefore, an example of the conditions will be described below. As a comparative example, a signal line X including the ground conductor 30 and no ground conductor 34, and a signal line Y including the ground conductor 34 and no ground conductor 30, in the signal line 10, are prepared.

Next, the signal lines 10, X, and Y are curved so that the signal wire 32 draws an arc with the same radius. At that time, the signal line 10 can retain the curved state, and the signal lines X and Y cannot retain the curved state. In that case, the curved states of the signal lines X and Y are not retained by the plastic deformation of only the ground conductor or ground conductor 34, and that of the signal line 10 is retained by the plastic deformation of the ground conductors 30 and 34. Then, the condition of the signal line 10 satisfying the state is defined as a condition to retain the curved state of the main body 12 by the plastic deformation of the ground conductors 30 and 34.

It is easy to retain, in the signal line 10, the state where the main body 12 is curved to project toward the negative-direction side in the z-axis direction. More specifically, in the signal line 10, the ground conductor 30 is sandwiched between the insulating sheets 22a and 22b from the z-axis direction, and attached more firmly to the insulating sheet 22b provided on the negative-direction side in the z-axis direction than to the insulating sheet 22a provided on the positive-direction side in the z-axis direction. Then, the main body 12 is curved to project toward the negative-direction side in the z-axis direction. Accordingly, the ground conductor 30 is not attached to the insulating sheet 22a on a main surface (top surface) which is positioned inside when being curved. Therefore, the force causing the insulating sheet 22a to expand when the main body 12 is curved hardly reaches the ground conductor 30. As a result, the restoring force causing the main body 12 to return to the linearly-extending state is decreased so that the state where the main body 12 is curved to project toward the negative-direction side in the z-axis direction is easily retained. In other words, therefore, it is desirable that the ground conductors 30 and 34 positioned inside when the main body 12 is curved not be attached to the insulating sheet 22 on the inner main surface.

Further, in the signal line 10, the curved state of the main body 12 is retained by the plastic deformation of the ground conductors 30 and 34 as described above. Therefore, the metal plate 504 is not added to the signal line 10, unlike the flexible printed substrate 500 disclosed in Japanese Unexamined Patent Application Publication No. 2006-165079. As a consequence, the electrical characteristic of the signal line 10 hardly deviates from the original value.

Although the insulating sheets 22a to 22d are preferably stacked in the above-described signal line 10, the insulating sheet 22a may be omitted and the insulating sheets 22b to 22d may be stacked to define the strip line structure. Since the number of the stacked insulating sheets 22 is decreased, the signal line 10 can be easily bent, and the U-shape of the bent signal line 10 can be easily retained. In that case, however, the ground conductor 30 of the insulating sheet 22b is exposed.

Hereinafter, a preferred embodiment of a method of manufacturing the signal line 10 will be described with reference to FIGS. 2A-2D. Although an example where the single signal line 10 is manufactured will be described below, a plurality of the signal lines 10 preferably is manufactured at the same time by stacking and cutting large insulating sheets in reality.

First, the insulating sheet 22 including a copper layer provided on the entire top surface is prepared. Processing is performed so that the surface roughness of the top surface of the copper layer of the prepared insulating sheet 22 becomes smaller than that of the back surface. More specifically, the top surface of the copper layer of the insulating sheet 22 is smoothed by being applied with zinc coating, for example. Planarization processing includes, for example, chemical polishing such as electrolytic polishing, and mechanical polishing.

Next, the external terminal 14 illustrated in FIGS. 2A-2D is provided on the top surface of the insulating sheet 22a. More specifically, a resist having the same shape as that of the external terminal 14 illustrated in FIGS. 2A-2D is printed on the copper layer of the insulating sheet 22a via a photolithography operation. Then, an etching process is performed for the copper layer to remove a portion of the copper layer, which is not covered with the resist. After that, the resist is removed to provide the external terminal 14 illustrated in FIGS. 2A-2D on the top surface of the insulating sheet 22a.

Next, the ground conductor 30 illustrated in FIGS. 2A-2D is provided on the top surface of the insulating sheet 22b. Further, the signal wire 32 illustrated in FIGS. 2A-2D is provided on the top surface of the insulating sheet 22c via a photolithography operation. Further, the ground conductor 34 illustrated in FIGS. 2A-2D is provided on the top surface of the insulating sheet 22d via a photolithography operation. Incidentally, since those photolithography operations are equivalent to the photolithography operation performed to provide the external terminal 14, the description thereof is omitted. According to the above-described operations, the insulating sheets 22b and 22d with the top surfaces where the ground conductors 30 and 34 are attached, and the insulating sheet 22c with the top surface where the signal wire 32 is attached are prepared.

Next, laser beams are applied to the positions where the via-hole conductors b1 to b16 of the insulating sheets 22a to 22c are provided to form via holes. Then, conductive pastes including copper or tin/silver alloy as the main ingredients are charged into the via holes formed in the insulating sheets 22a to 22c to provide the via-hole conductors b1 to b16 illustrated in FIGS. 2A-2D.

Next, the insulating sheets 22a to 22d are stacked in that order from the positive-direction side to the negative-direction side in the z-axis direction so that the ground conductor 30, the signal wire 32, and the ground conductor 34 define the strip line structure. Then, forces are exerted on the insulating sheets 22a to 22d from the positive-direction side and the negative-direction side in the z-axis direction so that the insulating sheets 22a to 22d are pressure-contacted. Accordingly, the signal line 10 illustrated in FIG. 1 is obtained.

Further, the description indicates that it is desirable that the ground conductors 30 and 34 positioned inside when the main body 12 is curved not be attached to the insulating sheet 22 on the inner main surface. Therefore, the ground conductor 34 may not be attached to the insulating sheet 22d. In that case, the main body 12 is easily curved to project toward the positive-direction side in the z-axis direction.

Further, when the ground conductor 30 is not attached to the insulating sheet 22a and the ground conductor 34 is not attached to the insulating sheet 22d, the main body 12 is easily curved to project toward both the positive-direction side and the negative-direction side in the z-axis direction.

However, the above statement does not prevent the ground conductors 30 and 34 positioned inside when the main body 12 is curved from being attached to the insulating sheet 22 on the inner main surface.

Incidentally, a multilayer substrate according to various preferred embodiments of the present invention is not limited to the signal line 10. Therefore, circuit substrates may be provided on both ends of the signal line 10, for example.

Preferred embodiments of the present invention are useful for a multilayer substrate, and excellent at retaining the curved state without causing fluctuations in the electrical characteristic, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
   a main body including a plurality of insulating sheets to be stacked and made of a flexible material;
   a signal wire disposed in the main body;
   a first ground conductor that is provided at one side of the signal wire in a stacking direction in the main body, such that the first ground conductor overlaps the signal wire in a plan view seen from the stacking direction; and
   a second ground conductor that is provided at the other side of the signal wire in the stacking direction in the main body, such that the second ground conductor overlaps the signal wire in the plan view seen from the stacking direction; wherein
   the main body including the signal wire retains a curved state by plastic deformation of the first and second ground conductors; and
   the main body is curved to project toward the other side in the stacking direction, and the first ground conductor is sandwiched between the insulating sheets in the stacking direction, and attached more weakly to the insulating sheet lying on the one side in the stacking direction than to the insulating sheet lying on the other side in the stacking direction.

2. The multilayer substrate according to claim 1, wherein when the main body including only one of the first and second ground conductors is curved, the curved state of the main body cannot be retained by plastic deformation of the first ground conductor or the second ground conductor.

3. The multilayer substrate according to claim 1, wherein the first ground conductor is plastically deformed in a state of contracting in a direction in which the signal wire extends, and the second ground conductor is plastically deformed in a state of expanding in the direction in which the signal wire extends.

4. The multilayer substrate according to claim 3, wherein expansion/contraction does not occur at specified positions on the insulating sheets when the main body is curved, the first ground conductor is provided on the one side in the stacking direction relative to the specified position, and the second ground conductor is provided on the other side in the stacking direction relative to the specified position.

5. The multilayer substrate according to claim 1, wherein each of the insulating sheets has a Young's modulus of about 2 GPa to about 30 GPa, and the signal wire and the first and second ground conductors have a Young's modulus of about 100 GPa to about 150 GPa.

6. The multilayer substrate according to claim 1, wherein each of the insulating sheets is made of a liquid-crystal polymer, and the signal wire and the first and second ground conductors are made of copper layers.

7. The multilayer substrate according to claim 1, wherein a thickness of the first and second ground conductors in the stacking direction is about 5 µm to about 25 µm.

8. The multilayer substrate according to claim 1, wherein spacing between the first and second ground conductors in the stacking direction is about 50 µm to about 200 µm.

* * * * *